United States Patent
Ikoma

(10) Patent No.: US 8,476,973 B2
(45) Date of Patent: Jul. 2, 2013

(54) SWITCH DEVICE AND LAYOUT DESIGN METHOD FOR SWITCH DEVICE

(75) Inventor: Heiji Ikoma, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/565,374

(22) Filed: Aug. 2, 2012

(65) Prior Publication Data

US 2012/0292718 A1    Nov. 22, 2012

Related U.S. Application Data

(63) Continuation of application No. PCT/JP2010/006319, filed on Oct. 26, 2010.

(30) Foreign Application Priority Data

Feb. 4, 2010    (JP) .................... 2010-023056

(51) Int. Cl.
*H03F 1/02* (2006.01)
(52) U.S. Cl.
USPC ............. 330/9; 330/253; 330/254; 330/261
(58) Field of Classification Search
USPC ................. 330/9, 253, 254, 261
See application file for complete search history.

(56) References Cited

U.S. PATENT DOCUMENTS

| | | | |
|---|---|---|---|
| 6,344,769 B1 * | 2/2002 | Giuroiu | 327/538 |
| 7,294,892 B2 | 11/2007 | Chen | |
| 7,408,387 B2 | 8/2008 | Suenaga | |
| 2004/0125004 A1 | 7/2004 | Suwa et al. | |
| 2006/0017596 A1 | 1/2006 | Ido et al. | |
| 2006/0267110 A1 | 11/2006 | Chen | |
| 2010/0182301 A1 * | 7/2010 | Yasuda | 345/211 |

FOREIGN PATENT DOCUMENTS

| | | |
|---|---|---|
| JP | 2004-208060 A | 7/2004 |
| JP | 2006-019818 A | 1/2006 |

OTHER PUBLICATIONS

International Search Report mailed Nov. 22, 2010 issued in corresponding International Application No. PCT/JP2010/006319.

\* cited by examiner

*Primary Examiner* — Telly Green
(74) *Attorney, Agent, or Firm* — McDermott Will & Emery LLP

(57) ABSTRACT

A switch device includes a plurality of differential switches formed in a semiconductor substrate. Each of the plurality of differential switches includes first and second differential transistors. The plurality of differential switches are placed in such a manner that the first differential transistors are adjacent to each other and the second differential transistors are adjacent to each other.

17 Claims, 14 Drawing Sheets

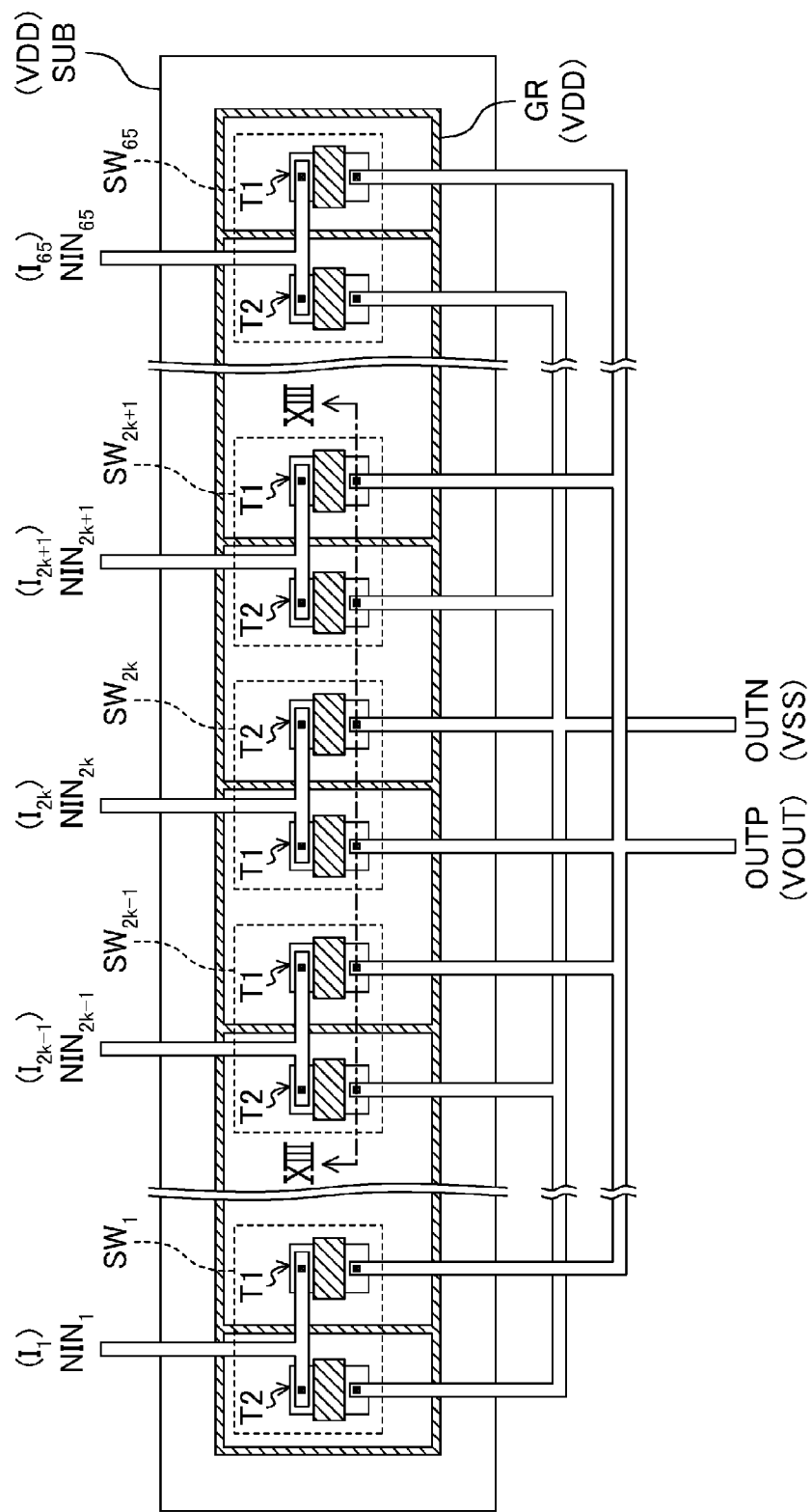

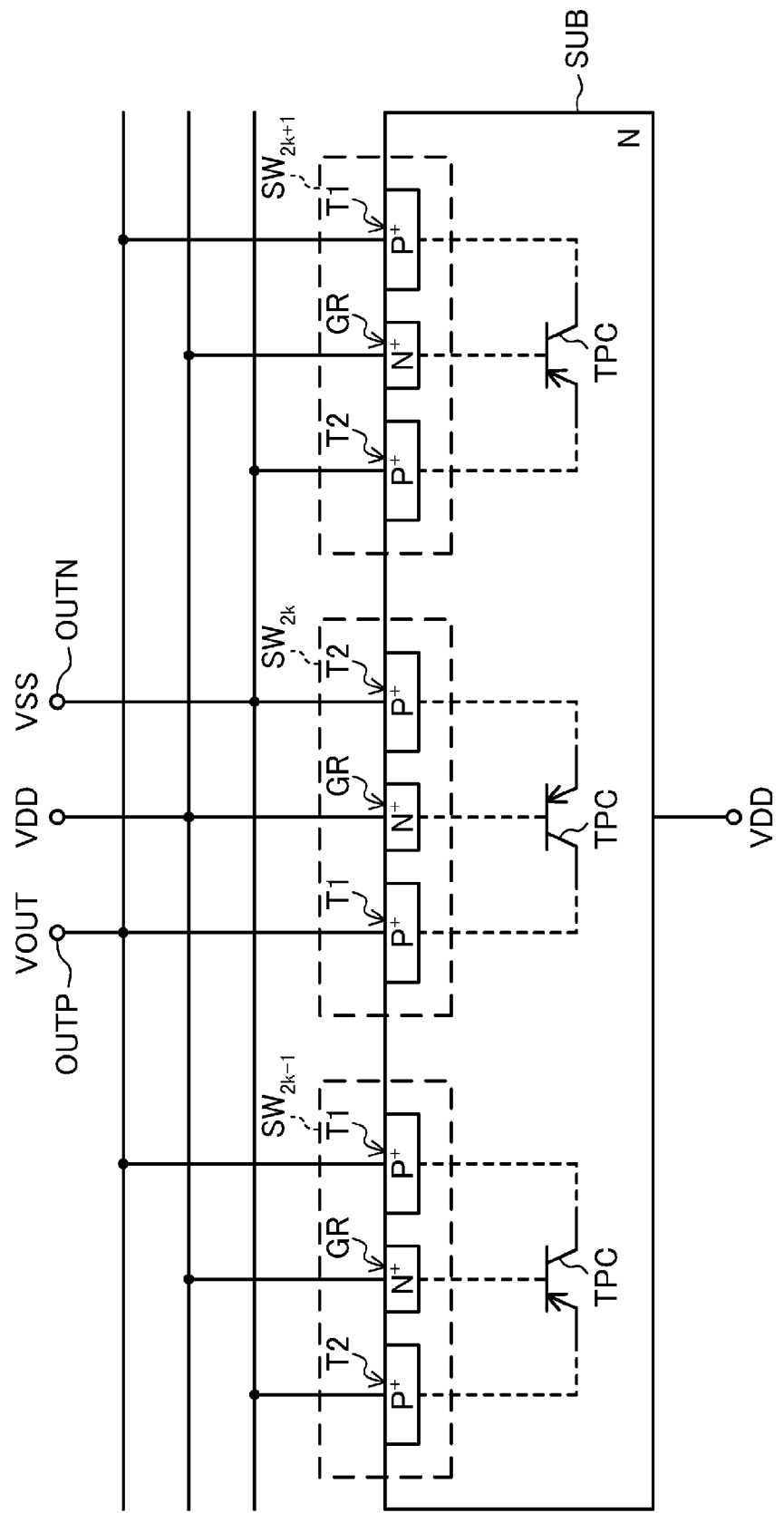

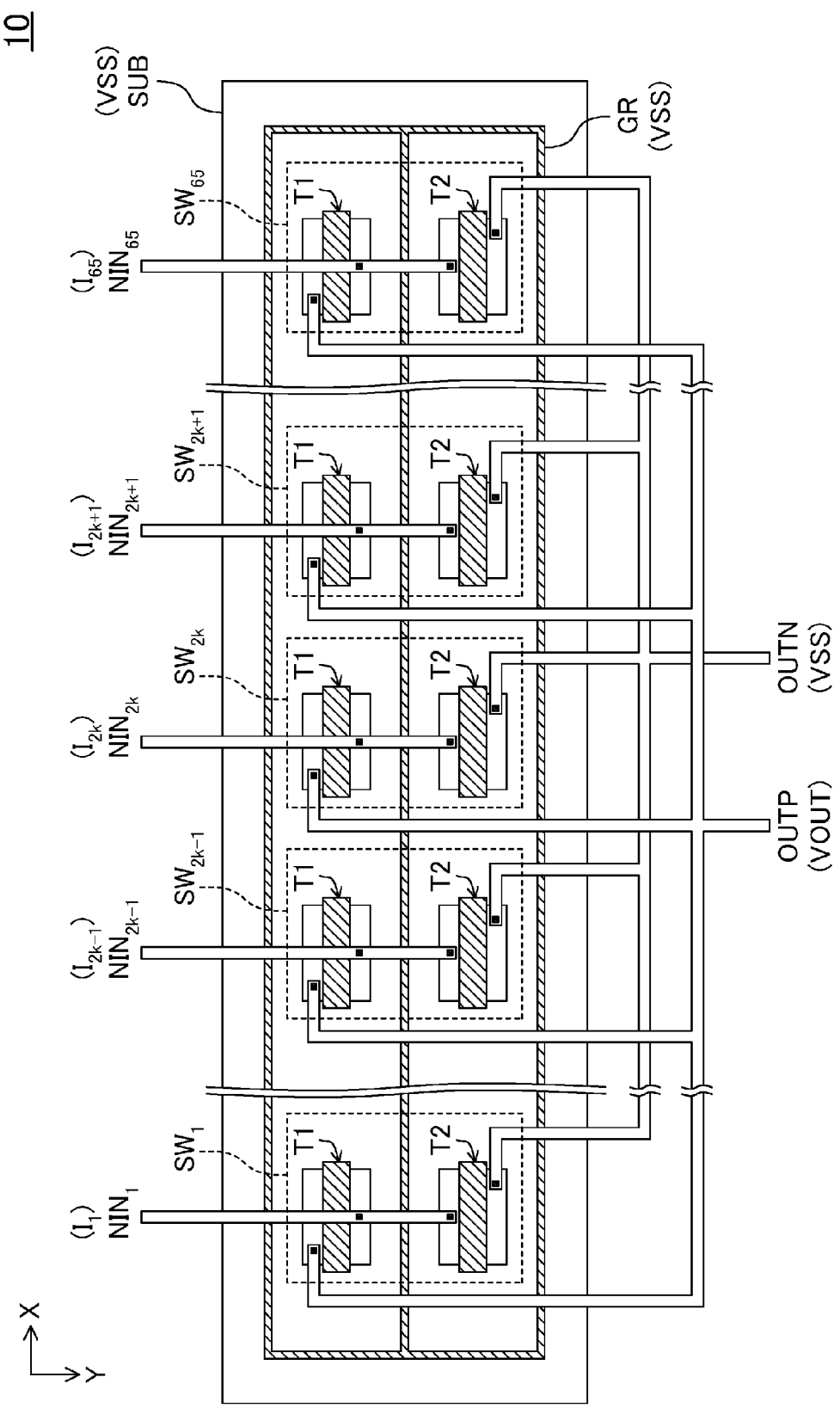

SWITCH DEVICE AND LAYOUT DESIGN METHOD FOR SWITCH DEVICE

CROSS-REFERENCE TO RELATED APPLICATION

This is a continuation of PCT International Application PCT/JP2010/006319 filed on Oct. 26, 2010, which claims priority to Japanese Patent Application No. 2010-023056 filed on Feb. 4, 2010. The disclosures of these applications including the specifications, the drawings, and the claims are hereby incorporated by reference in their entirety.

BACKGROUND

The present disclosure relates to a switch device including a plurality of differential switches, and more particularly to a layout technology for switch devices.

In recent years, current steering digital-analog (D/A) converters are used for video equipment such as plasma TV sets, Liquid crystal TV sets, organic EL TV sets, and Blu-ray recorders, communication equipment using various communication schemes such as wireless-LAN, power line communication (PLC), and millimeter-wave communication, etc. Such a current steering D/A converter includes a switch device that selectively outputs a plurality of output currents supplied from a plurality of current sources to a pair of output nodes (see U.S. Pat. No. 7,294,892, FIG. 1). This switch device includes a plurality of differential switches each having a pair of differential transistors, the drains of which are electrically connected to the pair of output nodes.

Such a switch device including a plurality of differential switches is also used for other semiconductor integrated circuits such as an HDMI pre-emphasis circuit (e.g., U.S. Pat. No. 7,408,387, FIG. 5) and a slew-rate control circuit.

SUMMARY

When a plurality of differential switches are formed in a semiconductor substrate, however, a parasitic bipolar transistor may sometimes be formed, not only between a pair of differential transistors of each of the differential switches, but also between any adjacent differential switches. Therefore, in order to enhance the surge protection capability (that is the resistance against an occurrence where a large current flows through a parasitic bipolar transistor, etc. due to a surge voltage causing melting of an interconnect, etc. (e.g., ESD breakdown, etc.)), measures must be taken to ensure that no large current will flow through such parasitic bipolar transistors.

It is an objective of this disclosure to provide a switch device having enhanced surge protection capability.

According to one aspect of this disclosure, a switch device includes a plurality of differential switches formed in a semiconductor substrate, each of the plurality of differential switches having a first differential transistor and a second differential transistor, wherein in each of the plurality of differential switches, one of a source and a drain of the first differential transistor is electrically connected to a first output node, the other of the source and the drain of the first differential transistor is electrically connected to an input node corresponding to the differential switch, and a first control signal corresponding to the differential switch is supplied to a gate of the first differential transistor, one of a source and a drain of the second differential transistor is electrically connected to a second output node, the other of the source and the drain of the second differential transistor is electrically connected to the input node corresponding to the differential switch, and a second control signal corresponding to the differential switch is supplied to a gate of the second differential transistor, and the plurality of differential switches are placed in the semiconductor substrate in such a manner that the first differential transistors are adjacent to each other and the second differential transistors are adjacent to each other.

In the switch device described above, since the emitter and collector of a parasitic bipolar transistor formed between any adjacent differential switches are to be electrically connected to the same output node. Therefore, even if a surge voltage is applied increasing the voltage difference between the first and second output nodes, no current will flow (or a current will not easily flow) through the parasitic bipolar transistor formed between the adjacent differential switches. Thus, the surge protection capability can be enhanced.

The switch device described above may further include a guard ring formed in the semiconductor substrate so as to serve as a block between the first differential transistor and the second differential transistor.

With the above configuration, no current will flow (or a current will not easily flow) through a parasitic bipolar transistor formed between the first differential transistor and the second differential transistor. Thus, the surge protection capability can be further enhanced.

According to another aspect of this disclosure, a layout design method for a switch device is a method for designing a layout of a switch device including a plurality of differential switches each having first and second differential transistors, the method including the steps of: (a) placing the plurality of differential switches in such a manner that the first differential transistors are adjacent to each other and the second differential transistors are adjacent to each other; and (b) placing interconnects in such a manner that, in each of the plurality of differential switches, one of a source and a drain of the first differential transistor is electrically connected to a first output node, the other of the source and the drain of the first differential transistor is electrically connected to an input node corresponding to the differential switch, and a first control signal corresponding to the differential switch is supplied to a gate of the first differential transistor, and one of a source and a drain of the second differential transistor is electrically connected to a second output node, the other of the source and the drain of the second differential transistor is electrically connected to an input node corresponding to the differential switch, and a second control signal corresponding to the differential switch is supplied to a gate of the second differential transistor.

The layout design method described above permits designing of a switch device with enhanced surge protection capability.

BRIEF DESCRIPTION OF THE DRAWINGS

FIG. 12 is a layout chart showing a layout example of the switch device shown in FIG. 11.

FIG. 13 is a cross-sectional view taken along line XIII-XIII in FIG. 12.

FIG. 14 is a layout chart of layout example 7 of the switch device.

DETAILED DESCRIPTION

Figure 1:
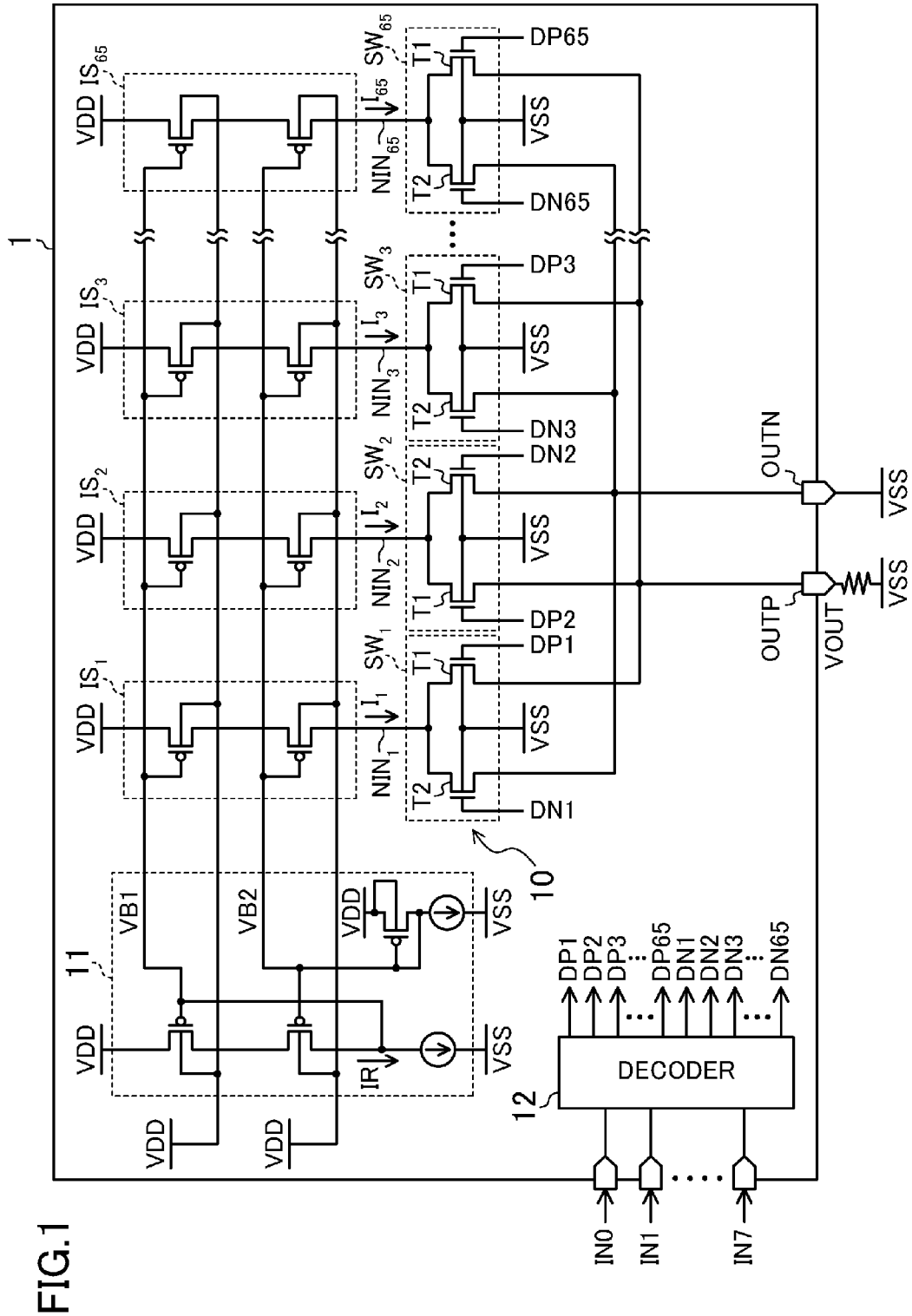
FIG. 1 is a circuit diagram of a D/A converter including a switch device.

Embodiments of the present disclosure will be described hereinafter in detail with reference to the accompanying drawings. It should be noted that the same or corresponding components are denoted by the same reference numerals throughout the drawings, and the description thereof will not be repeated.

(Digital-Analog Converter)

FIG. 1 shows an example configuration of a digital-analog (D/A) converter 1 including a switch device 10. In the illustrated example, the D/A converter 1, which is a current steering D/A converter, converts a digital code represented by eight bit values IN0, IN1, ..., IN7 (8-bit digital code) into an output voltage VOUT. The D/A converter 1 includes, in addition to the switch device 10, a bias circuit 11, 65 current sources $IS_1$, $IS_2$, $IS_3$, ..., $IS_{65}$, and a decoder 12.

[Bias Circuit and Current Sources]

The bias circuit 11 generates bias voltages VB1 and VB2 according to a reference current IR. The current sources $IS_1$, $IS_2$, $IS_3$, ..., $IS_{65}$ respectively supply output currents $I_1$, $I_2$, $I_3$, ..., $I_{65}$ generated according to the bias voltages VB1 and VB2 from the bias circuit 11. The current sources $IS_1$ and $IS_2$ correspond to the two least significant bits of the 8-bit digital code (e.g., bit values IN0, IN1), and the current sources $IS_3$, ..., $IS_{65}$ correspond to the six most significant bits of the digital code (e.g., bit values IN2, ..., IN7). The output currents $I_1$ and $I_2$ have current values weighted by ½ each, and the output currents $I_3$, ..., $I_{65}$ have the same current value. For example, assuming that the current value of the output current $I_1$ is "I," the current value of the output current $I_2$ is "2×I," and the current values of the output currents $I_3$, ..., $I_{65}$ are "4×I."

[Decoder]

The decoder 12 outputs 65 control signals DP1, DP2, ..., DP65 and 65 control signals DN1, DN2, ..., DN65 in response to the digital code represented by the bit values IN0, IN1, ..., IN7. The control signals DN1, DN2, ..., DN65 respectively correspond to the inverted signals of the control signals DP1, DP2, ..., DP65.

[Switch Device]

The switch device 10 includes 65 differential switches $SW_1$, $SW_2$, ..., $SW_{65}$ respectively corresponding to the 65 current sources $IS_1$, $IS_2$, ..., $IS_{65}$ (input nodes $NIN_1$, $NIN_2$, ..., $NIN_{65}$). Each of the differential switches $SW_1$, $SW_2$, ..., $SW_{65}$ has differential transistors T1 and T2. The differential switches $SW_1$, $SW_2$, ..., $SW_{65}$ respectively correspond to the control signals DP1, DP2, ..., DP65 and also correspond to the control signals DN1, DN2, ..., DN65. In the illustrated example, the differential transistors T1 and T2 are made of n-channel transistors.

Differential Transistors T1

The differential transistors T1, T1, ..., T1 of the differential switches $SW_1$, $SW_2$, ..., $SW_{65}$ respectively have sources electrically connected to an output node OUTP, drains electrically connected to the current sources $IS_1$, $IS_2$, ..., $IS_{65}$ corresponding to the differential switches $SW_1$, $SW_2$, ..., $SW_{65}$, and gates supplied with the control signals DP1, DP2, ..., DP65 corresponding to the differential switches $SW_1$, $SW_2$, ..., $SW_{65}$. The ground voltage VSS is supplied to the back gates of the differential transistors T1, T1, ..., T1 of the differential switches $SW_1$, $SW_2$, ..., $SW_{65}$. The output node OUTP is connected to a ground node (node supplied with the ground voltage VSS) via a load resistance.

Differential Transistors T2

The differential transistors T2, T2, ..., T2 of the differential switches $SW_1$, $SW_2$, ..., $SW_{65}$ respectively have sources electrically connected to an output node OUTN, drains electrically connected to the current sources $IS_1$, $IS_2$, ..., $IS_{65}$ corresponding to the differential switches $SW_1$, $SW_2$, ..., $SW_{65}$, and gates supplied with the control signals DN1, DN2, ..., DN65 corresponding to the differential switches $SW_1$, $SW_2$, ..., $SW_{65}$. The ground voltage VSS is supplied to the back gates of the differential transistors T2, T2, ..., T2 of the differential switches $SW_1$, $SW_2$, ..., $SW_{65}$. The output node OUTN is connected to the ground node.

[Digital-Analog Conversion]

For example, when the bit values (IN7, ..., IN1, IN0) of the digital code indicate "00001011," the decoder 12 sets the control signals DP1, DP2, DP3, and DP4 and the controls signals DN5, DN6, ..., DN65 at a high level (e.g., the power supply voltage VDD) while setting the control signals DN1, DN2, DN3, and DN4 and the controls signals DP5, DP6, ..., DP65 at a low level (e.g., the ground voltage VSS). With this setting, in the differential switches $SW_1$, $SW_2$, $SW_3$, and $SW_4$, the differential transistors T1 are turned on while the differential transistors T2 are turned off. In the differential switches $SW_5$, $SW_6$, ..., $SW_{65}$, the differential transistors T1 are turned off while the differential transistors T2 are turned on. As a result, the output voltage VOUT corresponding to the total value of the output currents $I_1$, $I_2$, $I_3$, and $I_4$ (11×I) is generated at the output node OUTP. In this way, the D/A converter 1 converts the digital code into the output voltage VOUT.

(Layout of Switch Device)

Figure 2:
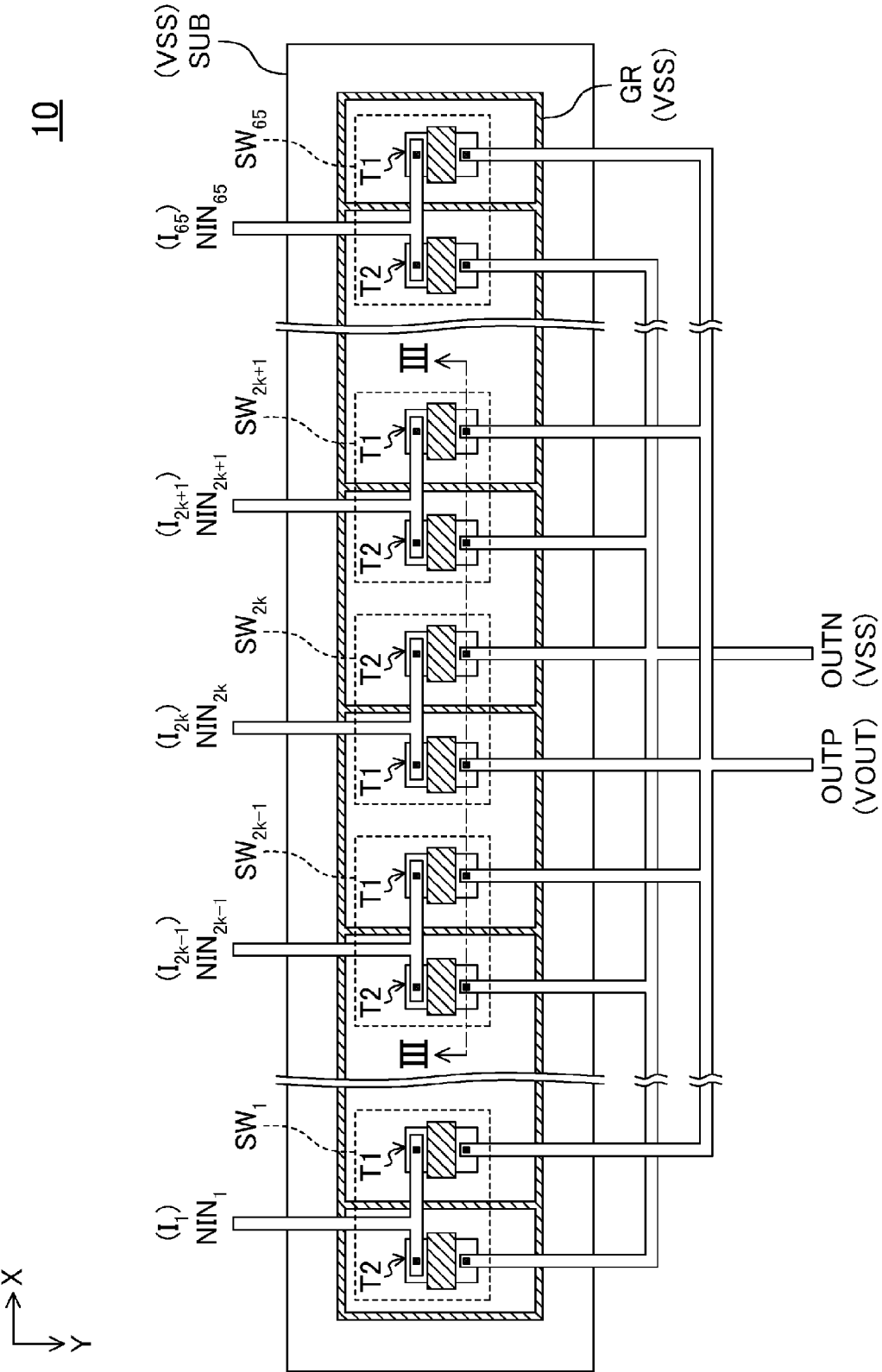
FIG. 2 is a layout chart showing layout example 1 of the switch device.
Figure 3:
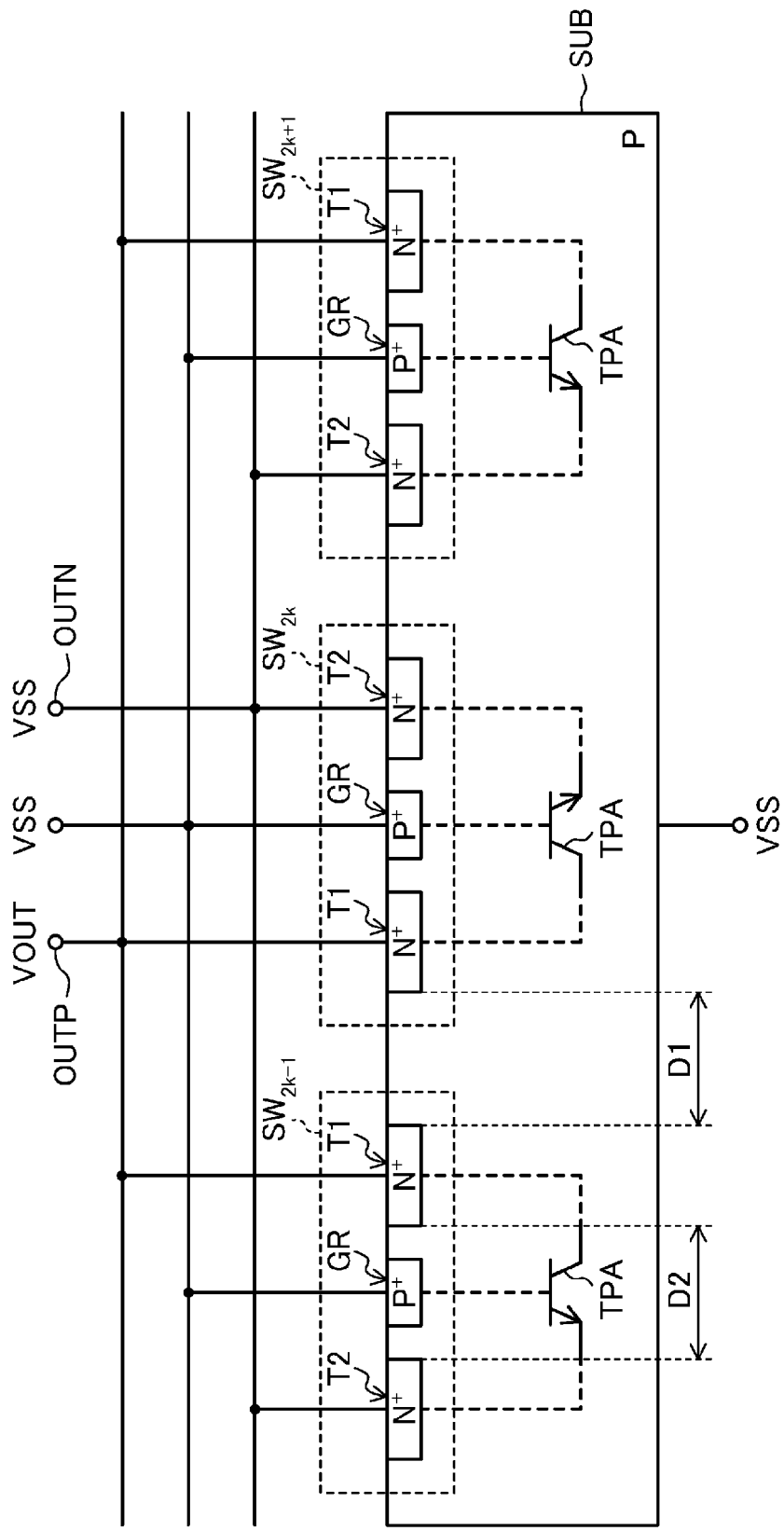
FIG. 3 is a cross-sectional view taken along line III-III in FIG. 2.

FIG. 2 shows a layout example of the switch device 10 in FIG. 1, and FIG. 3 shows an example cross-sectional view of the switch device 10 taken along line III-III in FIG. 2. Note that illustration is omitted in FIG. 2 for interconnects for supply of the control signals DP1, DP2, ..., DP65 to the gates of the differential transistors T1, T1, ..., T1 of the differential switches $SW_1$, $SW_2$, ..., $SW_{65}$ and interconnects for supply of the control signals DN1, DN2, ..., DN65 to the gates of the differential transistors T2, T2, ..., T2 of the differential switches $SW_1$, $SW_2$, ..., $SW_{65}$. This also applies to the subsequent layout charts (FIGS. 4, 6-10, 12, and 14).

The switch device 10 includes the differential switches $SW_1$, $SW_2$, ..., $SW_{65}$ formed in a semiconductor substrate SUB and a guard ring GR formed in the semiconductor substrate SUB. The differential switches $SW_1$, $SW_2$, ..., $SW_{65}$ are placed in the semiconductor substrate SUB in such a manner that the differential transistors T1 are adjacent to each other while the differential transistors T2 are adjacent to each other. The guard ring GR is formed in the semiconductor substrate SUB so as to serve as a block between the differential transistors T1 and the differential transistors T2. Note that the differential switches $SW_1$, $SW_2$, ..., $SW_{65}$ and the guard ring GR may be formed in a well formed in the semiconductor substrate SUB.

In the illustrated example, the semiconductor substrate SUB is a p-type substrate, the drains and sources of the differential transistors T1 and T2 (n-channel transistors) are formed of $n^+$-type diffusion regions, the guard ring GR is formed of a $p^+$-type diffusion region, and the ground voltage VSS is supplied to the semiconductor substrate SUB and the guard ring GR. Note that the n-channel differential transistors T1 and T2 and the $p^+$-type guard ring GR may be formed in a p-well formed in the semiconductor substrate SUB (n-type substrate).

In FIG. 2, also, the differential switches $SW_1$, $SW_2$, ..., $SW_{65}$ are arranged in line in the X-axis direction. The differential transistors T1, T1, ..., T1 and T2, T2, ..., T2 of the differential switches $SW_1$, $SW_2$, ..., $SW_{65}$ are arranged in the X-axis direction in such a manner that the differential transistor T1 of the 2k-th differential switch $SW_{2k}$ (where k is a natural number, and $1 \leq k \leq 32$ in the illustrated example) is adjacent to the differential transistor T1 of the (2k−1)th differential switch $SW_{2k-1}$ and the differential transistor T2 of the 2k-th differential switch $SW_{2k}$ is adjacent to the differential transistor T2 of the (2k+1)th differential switch $SW_{2k+1}$.

Moreover, in FIG. 2, the gate length direction of the differential transistors T1, T1, ..., T1 and T2, T2, ..., T2 of the differential switches $SW_1$, $SW_2$, ..., $SW_{65}$ corresponds with the Y-axis direction orthogonal to the X-axis direction. Also, the differential transistors T1 and T2 of each of the differential switches $SW_1$, $SW_2$, ..., $SW_{65}$ are placed symmetrically to each other with respect to the Y axis.

[Parasitic Bipolar Transistors]

As shown in FIG. 3, in each of the differential switches $SW_1$, $SW_2$, ..., $SW_{65}$, an NPN-type parasitic bipolar transistor TPA is formed by the sources (two $n^+$-type diffusion regions) of the differential transistors T1 and T2 and the semiconductor substrate SUB (p-type substrate). With the guard ring GR formed between the differential transistors T1 and T2, the base voltage of the parasitic bipolar transistor TPA is maintained at the voltage supplied to the guard ring GR (the ground voltage VSS in the illustrated example). Therefore, even if a surge voltage is applied increasing the voltage difference between the output nodes OUTP and OUTN (e.g., if a surge voltage is applied to the output node OUTP), no current will flow (or a current will not easily flow) through the parasitic bipolar transistor TPA.

Also, between the differential switches $SW_{2k-1}$ and $SW_{2k}$, an NPN-type parasitic bipolar transistor is formed by the sources (two $n^+$-type diffusion regions) of the differential transistors T1 and T1 of the differential switches $SW_{2k-1}$ and $SW_{2k}$ and the semiconductor substrate SUB (p-type substrate). Since both the emitter and collector of this parasitic bipolar transistor are in electrical connection to the output node OUTP, the emitter voltage and collector voltage of the parasitic bipolar transistor are the same (or substantially the same). Therefore, even if a surge voltage is applied increasing the voltage difference between the output nodes OUTP and OUTN, no current will flow through this parasitic bipolar transistor. It is therefore possible to neglect the presence of the parasitic bipolar transistor formed between the differential switches $SW_{2k-1}$ and $SW_{2k}$.

Similarly, between the differential switches $SW_{2k}$ and $SW_{2k+1}$, an NPN-type parasitic bipolar transistor is formed by the sources (two $n^+$-type diffusion regions) of the differential transistors T2 and T2 of the differential switches $SW_{2k}$ and $SW_{2k+1}$ and the semiconductor substrate SUB (p-type substrate). Both the emitter and collector of this parasitic bipolar transistor are in electrical connection to the output node OUTN. Therefore, even if a surge voltage is applied increasing the voltage difference between the output nodes OUTP and OUTN, no current will flow through this parasitic bipolar transistor. It is therefore possible to neglect the presence of the parasitic bipolar transistor formed between the differential switches $SW_{2k}$ and $SW_{2k-1}$.

Comparative Example

Figure 4:
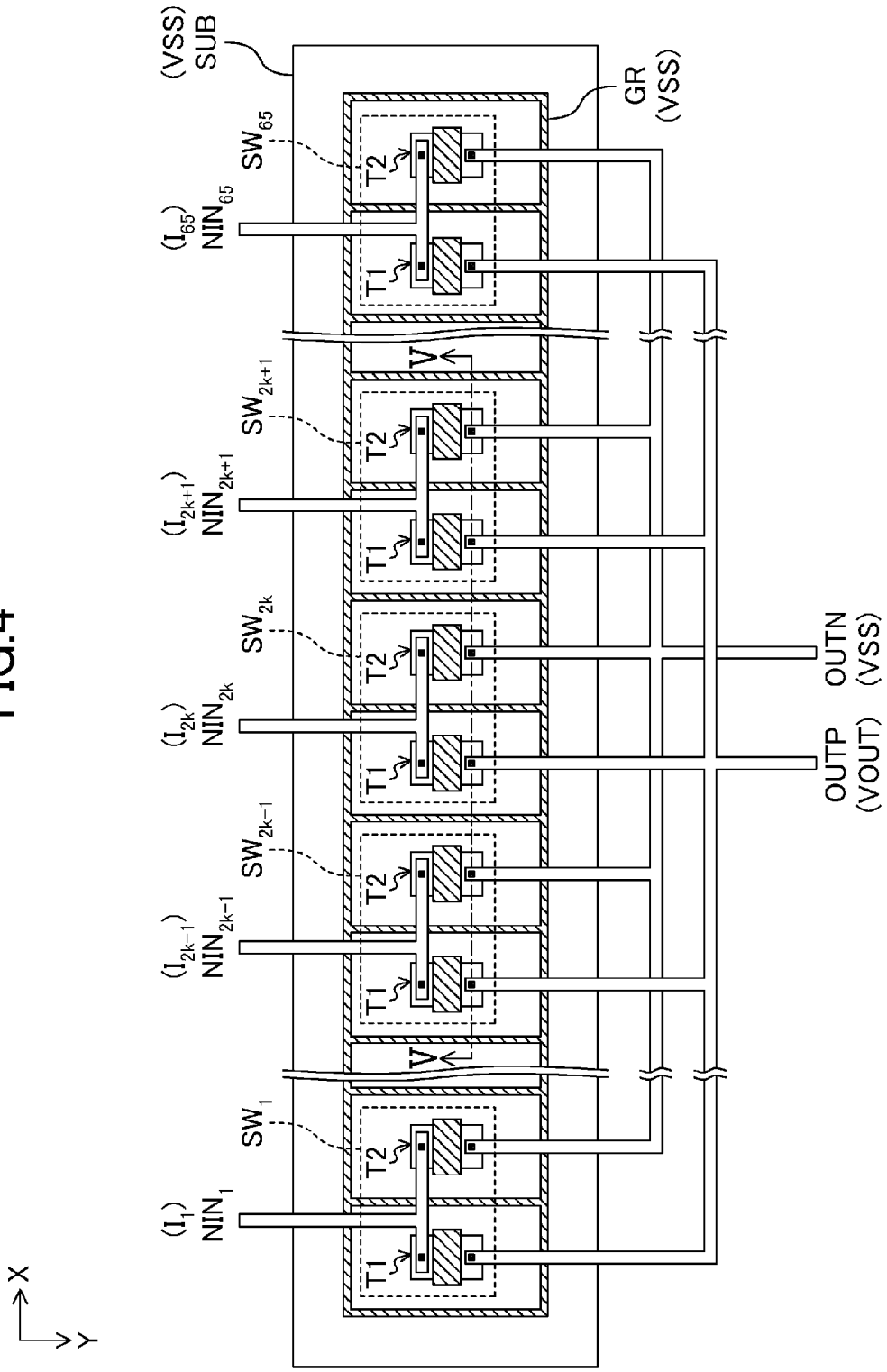
FIG. 4 is a layout chart of a comparative example of the switch device.
Figure 5:
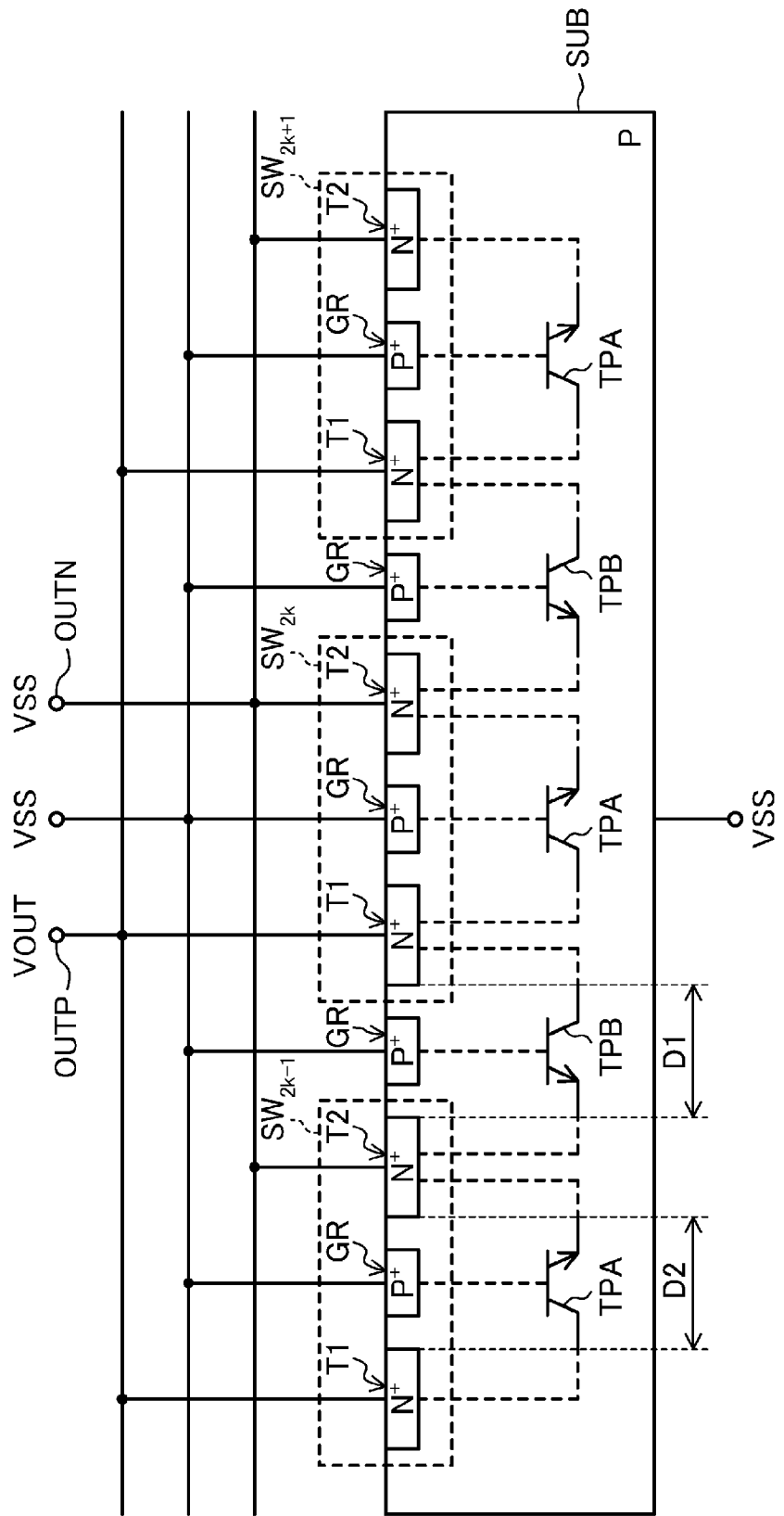
FIG. 5 is a cross-sectional view taken along line V-V in FIG. 4.

In contrast, when the differential switches $SW_1$, $SW_2$, ..., $SW_{65}$ are placed in the semiconductor substrate SUB in such a manner that the differential transistors T1 and the differential transistors T2 are adjacent to each other as shown in FIG. 4, a parasitic bipolar transistor TPA is formed in each of the differential switches $SW_{2k-1}$, $SW_{2k}$, and $SW_{2k+1}$ and parasitic bipolar transistors TPB and TPB are formed between the differential switches $SW_{2k-1}$ and $SW_{2k}$ and between the differential switches $SW_{2k}$ and $SW_{2k+1}$ as shown in FIG. 5. In this case, the emitter and collector of each of the parasitic bipolar transistors TPB formed between the adjacent differential switches are in electrical connection to the different output nodes. Therefore, if a surge voltage is applied increasing the voltage difference between the output nodes OUTP and OUTN, a large current may possibly flow through the parasitic bipolar transistor TPB. Thus, with the presence of the parasitic bipolar transistor IBP that cannot be neglected, the guard ring GR must be formed also between the differential switches $SW_{2k-1}$ and $SW_{2k}$ and between the differential switches $SW_{2k}$ and $SW_{2k+1}$. Otherwise, the spacing D1 between the adjacent differential switches $SW_1$, $SW_2$, ..., $SW_{65}$ must be widened to ensure that no current will flow (or a current will not easily flow) through the parasitic bipolar transistors TPB and TPB formed between the differential switches $SW_{2k-1}$, $SW_{2k}$, and $SW_{2k+1}$.

As described above, by placing the differential switches $SW_1$, $SW_2$, ..., $SW_{65}$ in the semiconductor SUB in such a manner that the differential transistors T1 are adjacent to each other while the differential transistors T2 are adjacent to each other, it is possible to ensure that no current will flow through a parasitic bipolar transistor formed between any adjacent differential switches. In this way, the surge protection capability (that is the resistance against an occurrence where a large current flows through a parasitic bipolar transistor, etc. due to a surge voltage causing melting of an interconnect, etc. (e.g., ESD breakdown, etc.)) can be enhanced.

Also, since no current flows through the parasitic bipolar transistors formed between the adjacent differential switches $SW_1$, $SW_2$, ..., $SW_{65}$, it is possible to narrow the spacing D1 between the adjacent differential switches $SW_1$, $SW_2$, ..., $SW_{65}$. For example, without the necessity of forming the guard ring GR between the adjacent differential switches $SW_1$, $SW_2$, ..., $SW_{65}$, the spacing D1 between the differential switches $SW_1$, $SW_2$, ..., $SW_{65}$ can be made narrower than the spacing D2 between the differential transistors T1 and T2 in each of the differential switches $SW_1$, $SW_2$, ..., $SW_{65}$. This can reduce the area occupied by the switch device.

Moreover, by forming the guard ring GR so as to serve as a block between the differential transistor T1 and the differential transistor T2, it is possible to ensure that no current will flow (or a current will not easily flow) through the parasitic bipolar transistor TPA formed in each of the differential switches $SW_1$, $SW_2$, ..., $SW_{65}$, thereby further enhancing the surge protection capability. Further, since the spacing D2 between the differential transistors T1 and T2 can be made narrow, compared with the case of forming no guard ring GR, the area occupied by the switch device can be further reduced.

Alternatively, the guard ring GR may not be formed, and the spacing D2 between the differential transistors T1 and T2 may be widened so as not to allow a current to flow easily through the parasitic bipolar transistor TPA in each of the differential switches $SW_1, SW_2, \ldots, SW_{65}$. With this configuration, also, where a current does not easily flow through the parasitic bipolar transistor formed in each of the differential switches $SW_1, SW_2, \ldots, SW_{65}$, the surge protection capability can be enhanced. Further, since the spacing D1 between the adjacent differential switches $SW_1, SW_2, \ldots, SW_{65}$ can be made narrow, compared with the case of FIG. 4, the area occupied by the switch device can be reduced.

(Configuration of Differential Transistors)

Figure 6:
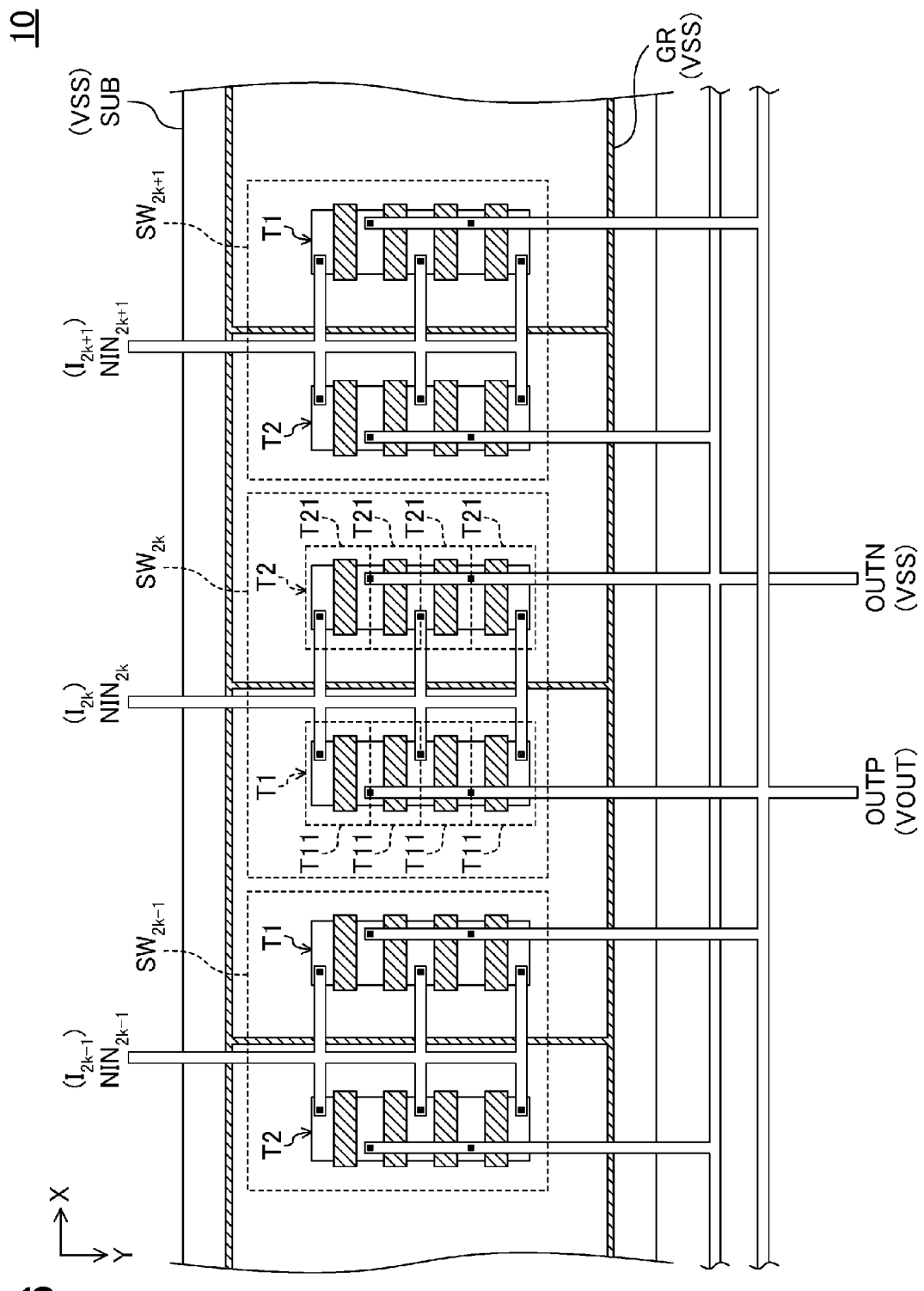
FIG. 6 is a layout chart showing layout example 2 of the switch device.

As shown in FIG. 6, in each of the differential switches $SW_1, SW_2, \ldots, SW_{65}$, the differential transistor T1 may be constituted by a plurality of (four in the illustrated example) unit transistors T11, T11, ..., T11, and the differential transistor T2 may be constituted by a plurality of (four in the illustrated example) unit transistors T21, T21, ..., T21. In FIG. 6, the unit transistors T11, T11, ..., T11 and the unit transistors T21, T21, ..., T21 are made of n-channel transistors.

In the differential switch $SW_{2k}$, each of the unit transistors T11, T11, ..., T11 has a source electrically connected to the output node OUTP, a drain electrically connected to the input node $NIN_{2k}$ corresponding to the differential switch $SW_{2k}$, and a gate supplied with the control signal $DP_{2k}$ corresponding to the differential switch $SW_{2k}$, and each of the unit transistors T21, T21, ..., T21 has a source electrically connected to the output node OUTN, a drain electrically connected to the input node $NIN_{2k}$ corresponding to the differential switch $SW_{2k}$, and a gate supplied with the control signal $DN_{2k}$ corresponding to the differential switch $SW_{2k}$. This also applies to the other differential switches $SW_1, \ldots, SW_{2k-1}, SW_{2k+1}, \ldots, SW_{65}$.

In FIG. 6, in each of the differential switches $SW_1, SW_2, \ldots, SW_{65}$, the gate length direction of the unit transistors T11, T11, ..., T11 and the unit transistors T21, T21, ..., T21 corresponds with the Y-axis direction. Moreover, in each of the differential switches $SW_1, SW_2, \ldots, SW_{65}$, the unit transistors T11, T11, ..., T11 and the unit transistors T21, T21, ..., T21 are arranged in the Y-axis direction in such a manner that the unit transistors T11, T11, ..., T11 respectively face the unit transistors T21, T21, ..., T21 in the X-axis direction.

(Placement of Differential Switches)

Figure 7:
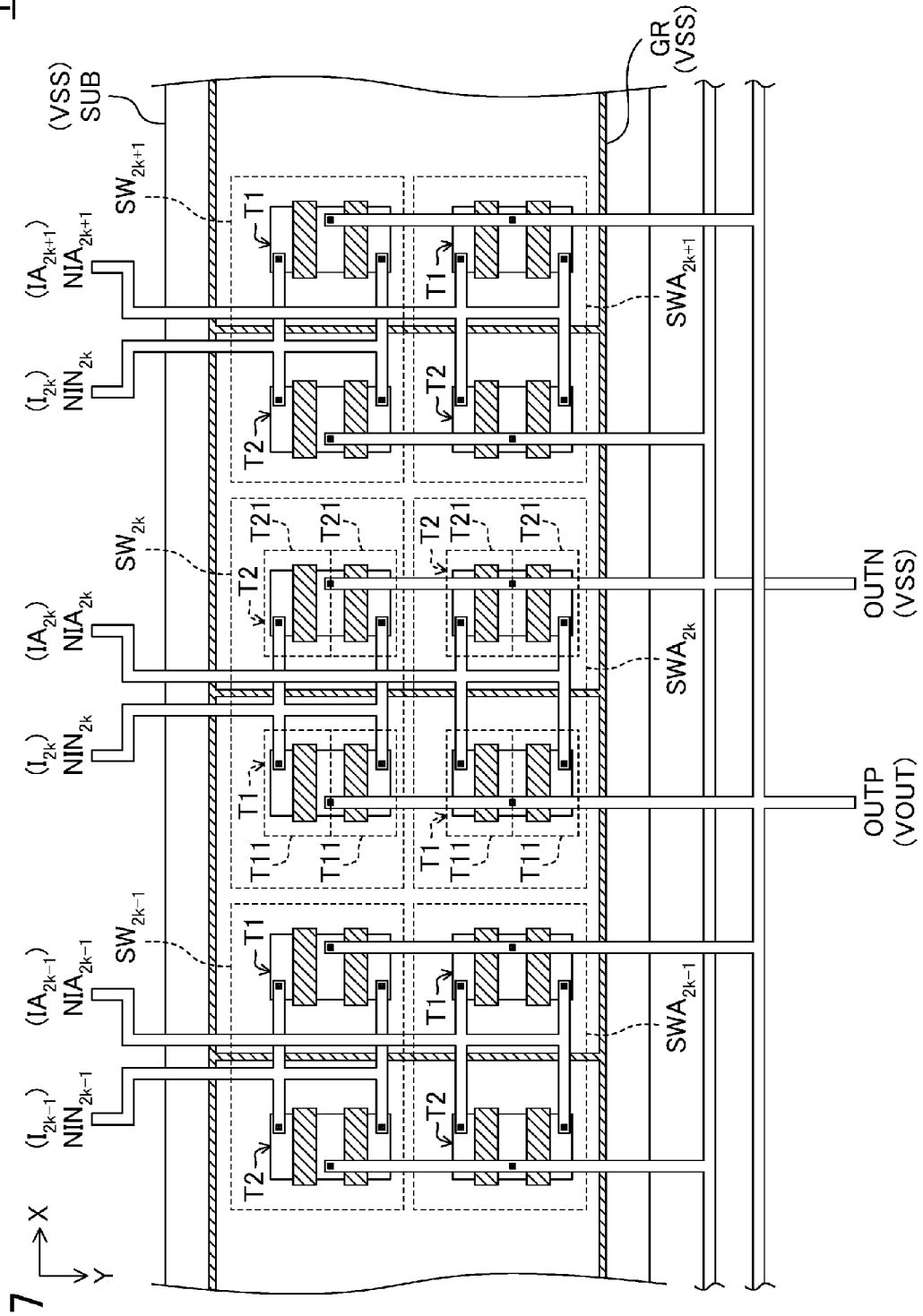
FIG. 7 is a layout chart showing layout example 3 of the switch device.

As shown in FIG. 7, the switch device 10 may further include differential switches $SWA_1, SWA_2, \ldots, SWA_{65}$, in addition to the differential switches $SW_1, SW_2, \ldots, SW_{65}$. In FIG. 7, the differential switches $SW_1, SW_2, \ldots, SW_{65}, SWA_1, SWA_2, \ldots, SWA_{65}$ are placed in a matrix of n rows and m columns (2 rows and 65 columns in the illustrated example) where the X-axis direction and the Y-axis direction are respectively defined as the row direction and the column direction.

In FIG. 7, the differential switches $SWA_1, SWA_2, \ldots, SWA_{65}$ respectively correspond to input nodes $NIA_1, NIA_2, \ldots, NIA_{65}$ (to which output currents $IA_1, IA_2, \ldots, IA_{65}$, for example, are respectively supplied). The input nodes $NIN_1, NIN_2, \ldots, NIN_{65}, NIA_1, NIA_2, \ldots, NIA_{65}$ are arranged in the X-axis direction in the order of $NIN_1, NIA_1, NIN_2, NIA_2, \ldots, NIN_{65}, NIA_{65}$. As in the differential switches $SW_1, SW_2, \ldots, SW_{65}$, first control signals (65 control signals) corresponding to the differential switches $SWA_1, SWA_2, \ldots, SWA_{65}$ are supplied to the gates of differential transistors T1, T1, ..., T1 of the differential switches $SWA_1, SWA_2, \ldots, SWA_{65}$, while second control signals (65 control signals) corresponding to the differential switches $SWA_1, SWA_2, \ldots, SWA_{65}$ are supplied to the gates of differential transistors T2, T2, ..., T2 of the differential switches $SWA_1, SWA_2, \ldots, SWA_{65}$.

In each of the rows of differential switches (the row of the differential switches $SW_1, SW_2, \ldots, SW_{65}$ and the row of the differential switches $SWA_1, SWA_2, \ldots, SWA_{65}$ in the illustrated example), the differential transistors T1, T1, ..., T1 and differential transistors T2, T2, ..., T2 of the differential switches of one row are arranged in the X-axis direction in such a manner that the differential transistor T1 of the 2k-th differential switch ($SW_{2k}$ or $SWA_{2k}$) is adjacent to the differential transistor T1 of the (2k−1)th differential switch ($SW_{2k-1}$ or $SWA_{2k-1}$) and the differential transistor T2 of the 2k-th differential switch is adjacent to the differential transistor T2 of the (2k+1)th differential switch ($SW_{2k+1}$ or $SWA_{2k+1}$).

In each of the columns of differential switches (the column of the differential switches $SW_1$ and $SWA_1$, ..., the column of the differential switches $SW_{2k-1}$ and $SWA_{2k-1}$, the column of the differential switches $SW_{2k}$ and $SWA_{2k}$, the column of the differential switches $SW_{2k+1}$ and $SWA_{2k+1}$, ..., the column of the differential switches $SW_{65}$ and $SWA_{65}$), the differential transistors T1, T1, ..., T1 and the differential transistors T2, T2, ..., T2 of the differential switches of one column are arranged in the Y-axis direction in such a manner that the differential transistors T1, T1, ..., T1 respectively face the differential transistors T2, T2, ..., T2 in the X-axis direction.

Also, in FIG. 7, in each of the differential switches $SW_1, SW_2, \ldots, SW_{65}, SWA_1, SWA_2, \ldots, SWA_{65}$, the differential transistor T1 is constituted by a plurality of unit transistors (two unit transistors T11 and T11 in FIG. 7), and the differential transistor T2 is constituted by a plurality of unit transistors (two unit transistors T21 and T21 in FIG. 7). Note however that each of the differential transistors T1 and T2 may be constituted by a single transistor.

Although the total number of input nodes is "130 (65+65)" in the illustrated example, if the total number of input nodes is "65" (e.g., if this configuration is applied to the D/A converter 1 shown in FIG. 1), the switch device 10 may have 33 differential switches $SW_1, SW_2, \ldots, SW_{33}$ corresponding to the odd-numbered input nodes $NIN_1, NIN_3, \ldots, NIN_{65}$ (33 input nodes), out of the input nodes $NIN_1, NIN_2, \ldots, NIN_{65}$, and 32 differential switches $SWA_1, SWA_2, \ldots, SWA_{32}$ corresponding to the even-numbered input nodes $NIN_2, NIN_4, \ldots, NIN_{64}$ (32 input nodes).

(Gate Length Direction of Differential Transistors)

Figure 8:
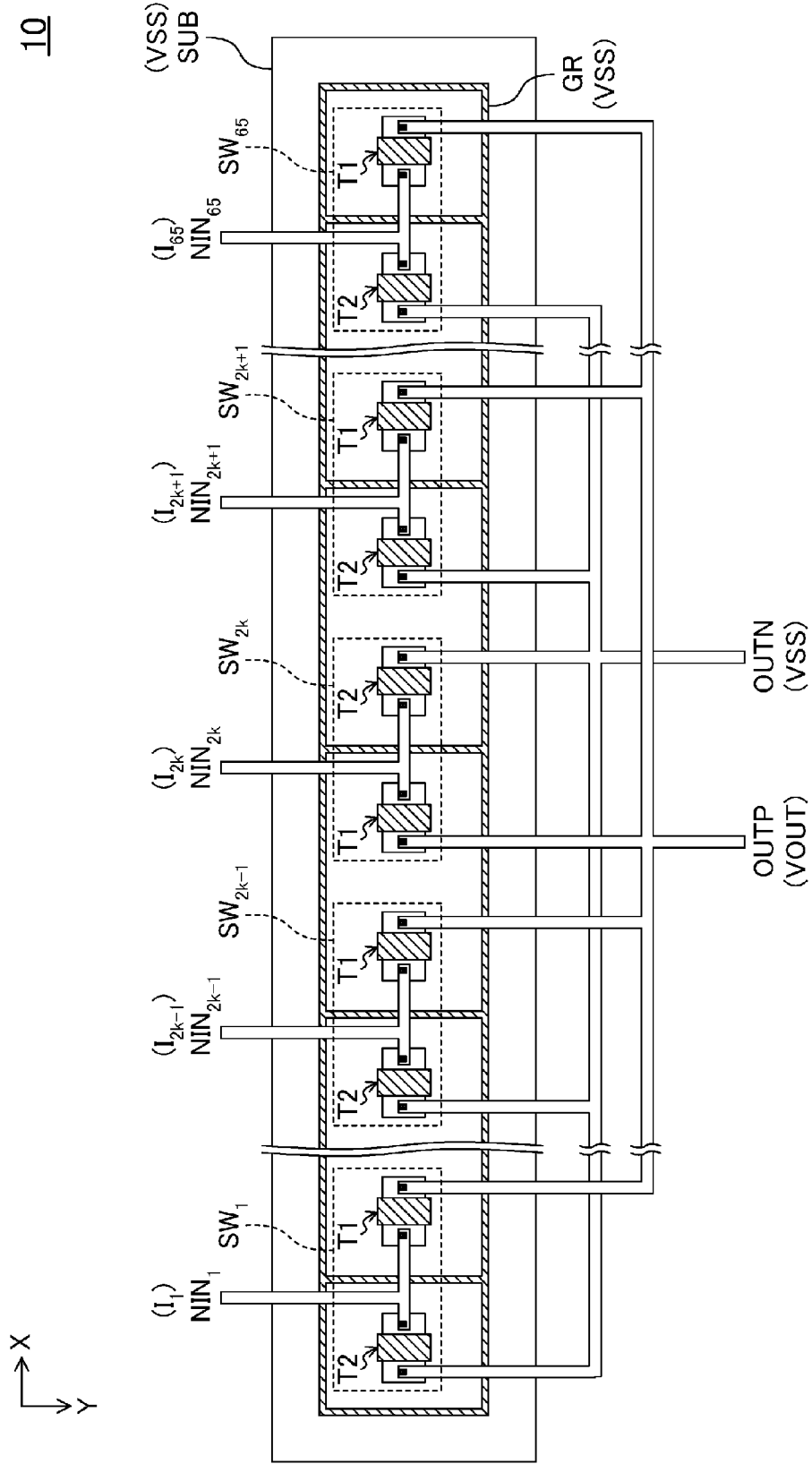
FIG. 8 is a layout chart showing layout example 4 of the switch device.

As shown in FIG. 8, the gate length direction of the differential transistors T1, T1, ..., T1 and differential transistors T2, T2, ..., T2 of the differential switches $SW_1, SW_2, \ldots, SW_{65}$ may correspond with the X-axis direction.

Figure 9:
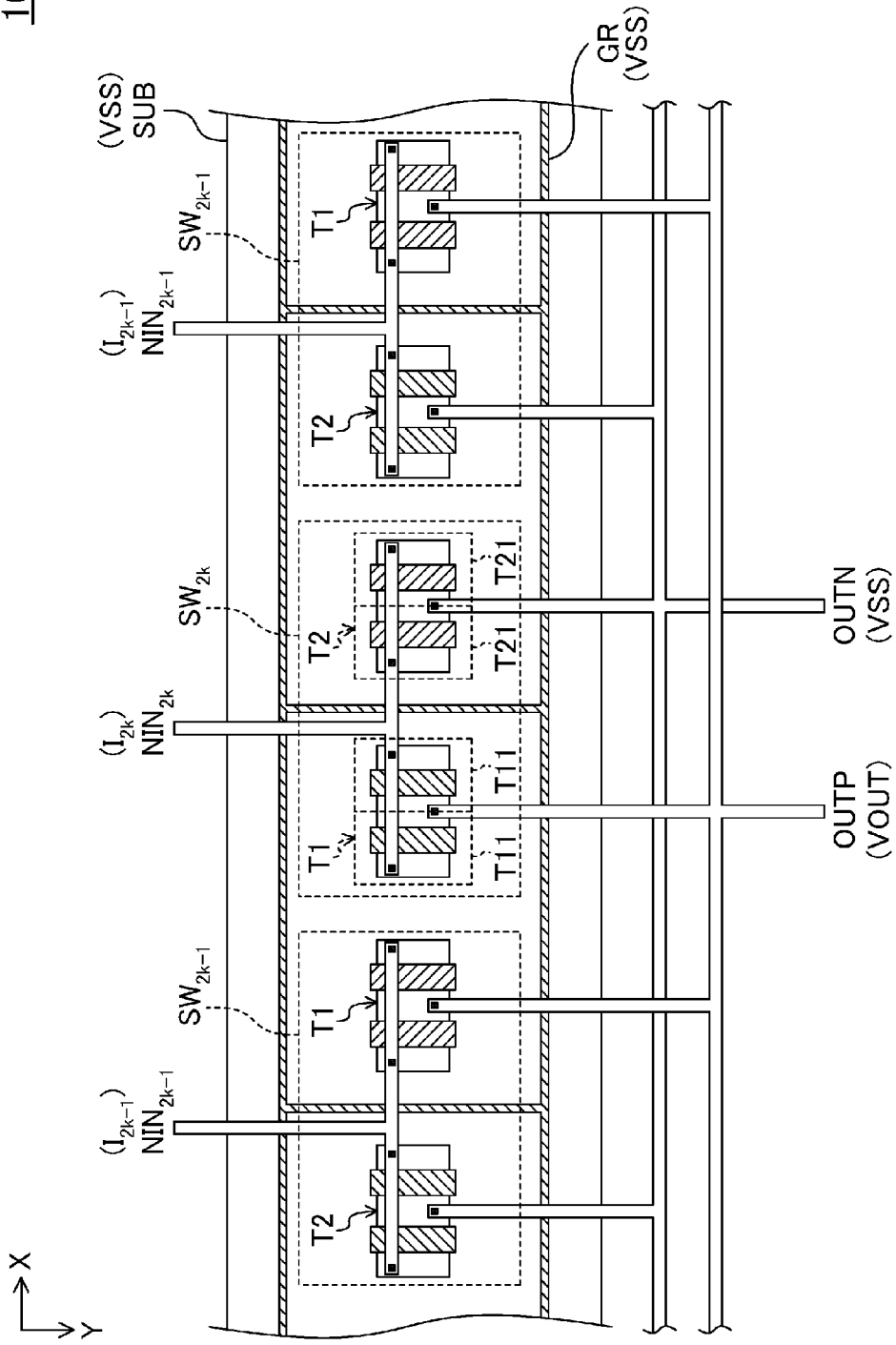
FIG. 9 is a layout chart showing layout example 5 of the switch device.

Also, as shown in FIG. 9, in each of the differential switches $SW_1, SW_2, \ldots, SW_{65}$, the differential transistor T1 may be constituted by a plurality of unit transistors (two unit transistors T11 and T11 in FIG. 9), and the differential transistor T2 may be constituted by a plurality of unit transistors (two unit transistors T21 and T21 in FIG. 9). In FIG. 9, in each of the differential switches $SW_1, SW_2, \ldots, SW_{65}$, the gate length direction of the unit transistors T11, T11, ..., T11 and the unit transistors T21, T21, ..., T21 corresponds with the X-axis direction. In FIG. 9, also, the unit transistors T11, T11, ..., T11 and unit transistors T21, T21, ..., T21 of the differential switches $SW_1, SW_2, \ldots, SW_{65}$ are arranged in line in the X-axis direction.

Figure 10:
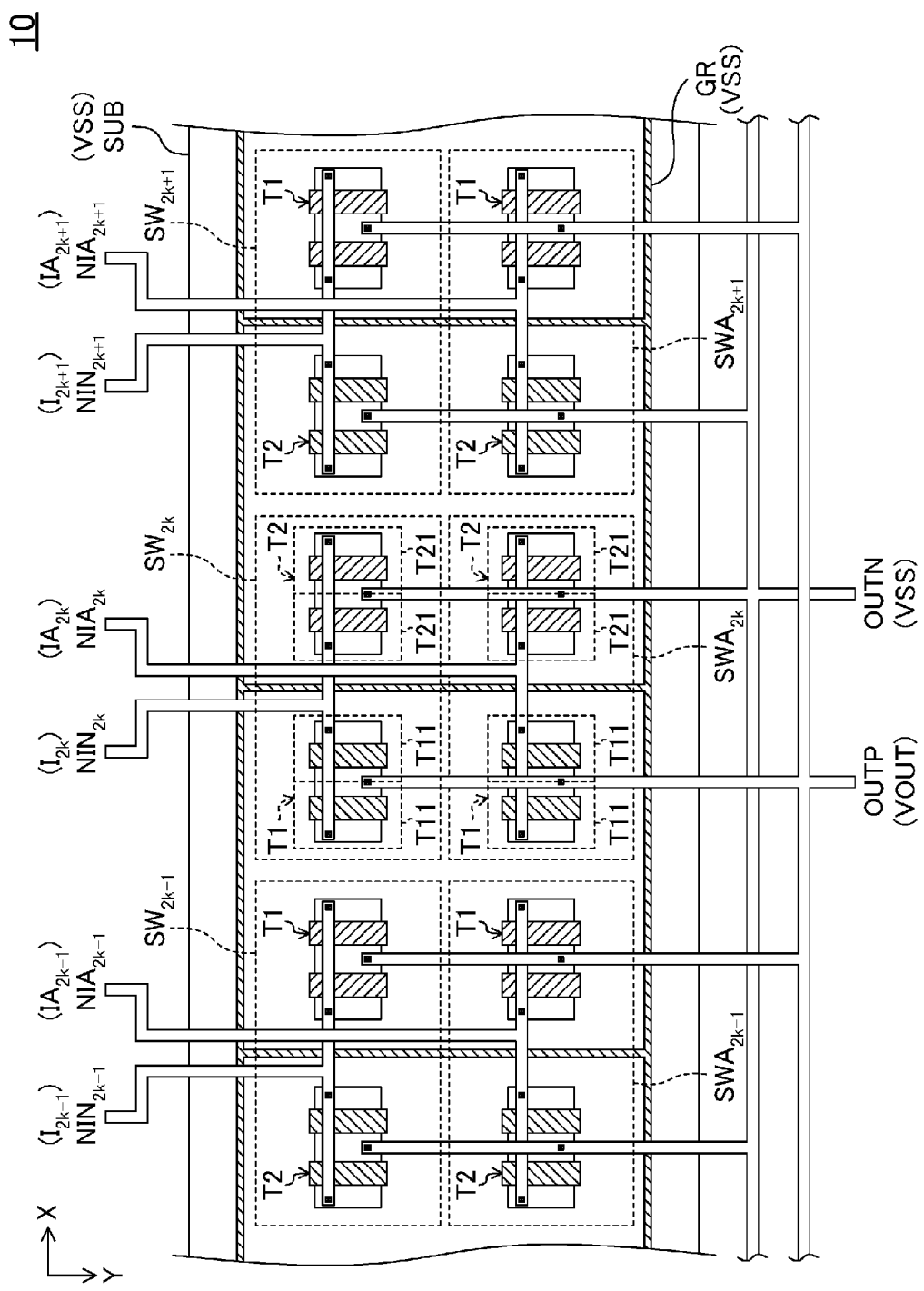
FIG. 10 is a layout chart showing layout example 6 of the switch device.

Moreover, as shown in FIG. 10, the switch device 10 may further include differential switches $SWA_1, SWA_2, \ldots, SWA_{65}$, in addition to the differential switches $SW_1$, $SW_2, \ldots, SW_{65}$ shown in FIG. 9. In FIG. 10, the differential switches $SW_1, SW_2, \ldots, SW_{65}, SWA_1, SWA_2, \ldots, SWA_{65}$ are placed in a matrix of n rows and m columns (2 rows and 65 columns in the illustrated example) where the X-axis direction and the Y-axis direction are respectively defined as the row direction and the column direction. In FIG. 10, also, the gate length direction of the differential transistors T1, T1, ..., T1 and differential transistors T2, T2, ..., T2 (the gate length direction of the unit transistors T11, T11, ..., T11 and unit transistors T21, T21, ..., T21) of the differential switches $SW_1, SW_2, \ldots, SW_{65}$ correspond with the X-axis direction. In FIG. 10, each of the differential transistors T1 and T2 may be constituted by a single transistor.

(Polarity of Differential Transistors)

Figure 11:
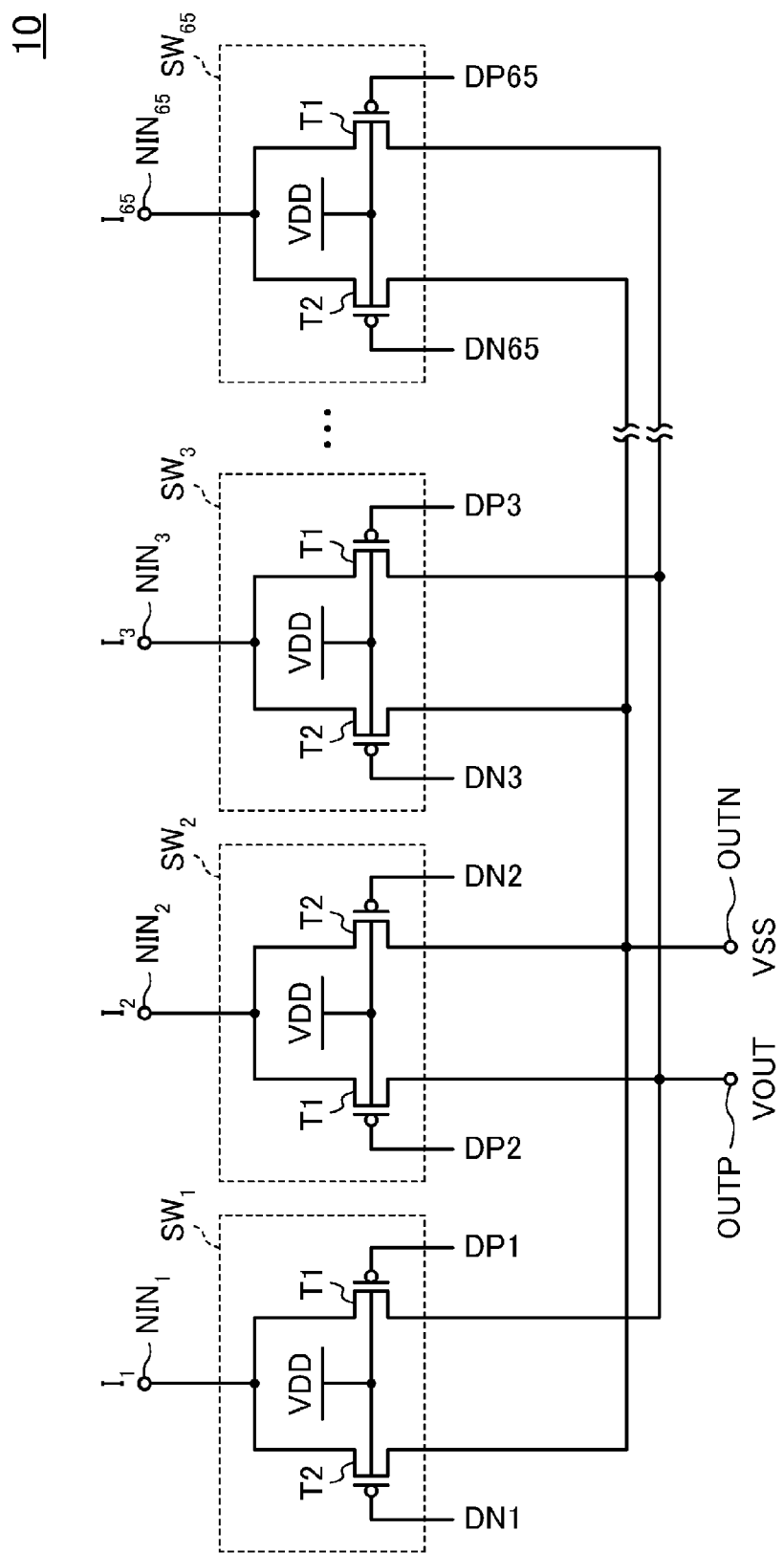
FIG. 11 is a view shown to explain the polarity of differential transistors.

As shown in FIG. 11, the differential transistors T1 and T2 of the differential switches $SW_1, SW_2, \ldots, SW_{65}$ may be made of p-channel transistors. In FIG. 11, the differential transistors T1, T1, ..., T1 of the differential switches $SW_1, SW_2, \ldots, SW_{65}$ respectively have drains electrically connected to the output node OUTP, sources electrically connected to the input nodes $NIN_1, NIN_2, \ldots, NIN_{65}$ corresponding to the differential switches $SW_1, SW_2, \ldots, SW_{65}$, and gates supplied with the control signals DP1, DP2, ..., DP65 corresponding to the differential switches $SW_1, SW_2, \ldots, SW_{65}$. Likewise, the differential transistors T2, T2, ..., T2 of the differential switches $SW_1, SW_2, \ldots, SW_{65}$ respectively have drains electrically connected to the output node OUTN, sources electrically connected to the input nodes $NIN_1, NIN_2, \ldots, NIN_{65}$ corresponding to the differential switches $SW_1, SW_2, \ldots, SW_{65}$, and gates supplied with the control signals DN1, DN2, ..., DN65 corresponding to the differential switches $SW_1, SW_2, \ldots, SW_{65}$. The power supply voltage VDD is applied to the back gates of the differential transistors T1, T1, ..., T1 and differential transistors T2, T2, ..., T2 of the differential switches $SW_1, SW_2, \ldots, SW_{65}$.

FIG. 12 shows a layout example of the switch device shown in FIG. 11, and FIG. 13 shows an example cross-sectional view of the switch device taken along line XIII-XIII in FIG. 12. In the illustrated example, the semiconductor substrate SUB is an n-type substrate, the drains and sources of the differential transistors T1 and T2 (p-channel transistors) are formed of $p^+$-type diffusion regions, the guard ring GR is formed of an $n^+$-type diffusion region, and the power supply voltage VDD is applied to the semiconductor substrate SUB and the guard ring GR. Note that the p-channel differential transistors T1 and T2 and the $n^+$-type guard ring GR may be formed in an n-well formed in the semiconductor substrate SUB (p-type substrate).

As shown in FIG. 13, in each of the differential switches $SW_1, SW_2, \ldots, SW_{65}$, an PNP-type parasitic bipolar transistor TPC is formed by the drains (two $p^+$-type diffusion regions) of the differential transistors T1 and T2 and the semiconductor substrate SUB (n-type substrate). Also, with the guard ring GR formed between the differential transistors T1 and T2, the spacing between the differential transistors T1 and T2 is wide. Therefore, even if a surge voltage is applied increasing the voltage difference between the output nodes OUTP and OUTN, no current will flow (or a current will not easily flow) through the parasitic bipolar transistor TPC.

Also, between the differential switches $SW_{2k-1}$ and $SW_{2k}$, a PNP-type parasitic bipolar transistor is formed by the drains (two $p^+$-type diffusion regions) of the differential transistors T1 and T1 of the differential switches $SW_{2k-1}$ and $SW_{2k}$ and the semiconductor substrate SUB (n-type substrate). Both the emitter and collector of this parasitic bipolar transistor are in electrical connection to the output node OUTP. Therefore, even if a surge voltage is applied increasing the voltage difference between the output nodes OUTP and OUTN, no current will flow through this parasitic bipolar transistor. It is therefore possible to neglect the presence of the parasitic bipolar transistor formed between the differential switches $SW_{2k-1}$ and $SW_{2k}$.

Likewise, between the differential switches $SW_{2k}$ and $SW_{2k+1}$, an PNP-type parasitic bipolar transistor is formed by the drains (two $p^+$-type diffusion regions) of the differential transistors T2 and T2 of the differential switches $SW_{2k}$ and $SW_{2k+1}$ and the semiconductor substrate SUB (n-type substrate). Both the emitter and collector of this parasitic bipolar transistor are in electrical connection to the output node OUTN. Therefore, even if a surge voltage is applied increasing the voltage difference between the output nodes OUTP and OUTN, no current will flow through this parasitic bipolar transistor. It is therefore possible to neglect the presence of the parasitic bipolar transistor formed between the differential switches $SW_{2k}$ and $SW_{2k+1}$.

In FIG. 12, the differential transistor T1 may be constituted by a plurality of unit transistors T11, T11, ..., T11, and the differential transistor T2 may be constituted by a plurality of unit transistors T21, T21, ..., T21 (see FIG. 6, for example). In this case, the unit transistors T11, T11, ..., T11 and the unit transistors T21, T21, ..., T21 are made of p-channel transistors. In the differential switch $SW_{2k}$, each of the unit transistors T11, T11, ..., T11 has a drain electrically connected to the output node OUTP, a source electrically connected to the input node $NIN_{2k}$ corresponding to the differential switch $SW_{2k}$, and a gate supplied with the control signal $DP_{2k}$ corresponding to the differential switch $SW_{2k}$, and each of the unit transistors T21, T21, ..., T21 has a drain electrically connected to the output node OUTN, a source electrically connected to the input node $NIN_{2k}$ corresponding to the differential switch $SW_{2k}$, and a gate supplied with the control signal $DN_{2k}$ corresponding to the differential switch $SW_{2k}$. This also applies to the other differential switches $SW_1, \ldots, SW_{2k-1}, SW_{2k+1}, \ldots, SW_{65}$.

In FIG. 12, also, the differential switches $SW_1, SW_2, \ldots, SW_{65}$ may be placed in a matrix of n rows and m columns where the X-axis direction and the Y-axis direction are respectively defined as the row direction and the column direction (see FIG. 7, for example). Further, in FIG. 12, the gate length direction of the differential transistors T1, T1, ..., T1 and differential transistors T2, T2, ..., T2 of the differential switches $SW_1, SW_2, \ldots, SW_{65}$ may correspond with the X-axis direction or the Y-axis direction.

(Placement of Differential Switches)

As shown in FIG. 14, the differential switches $SW_1, SW_2, \ldots, SW_{65}$ may be arranged in line in the X-axis direction, and the differential transistors T1, T1, ..., T1 and differential transistors T2, T2, ..., T2 of the differential switches $SW_1, SW_2, \ldots, SW_{65}$ may be arranged in the X-axis direction in such a manner that the differential transistors T1, T1, ..., T1 respectively face the differential transistors T2, T2, ..., T2 in the Y-axis direction.

In FIG. 14, the differential transistor T1 may be constituted by a plurality of unit transistors T11, T11, ..., T11, and the differential transistor T2 may be constituted by a plurality of unit transistors T21, T21, ..., T21. Also, the differential switches $SW_1, SW_2, \ldots, SW_{65}$ may be placed in a matrix of n rows and m columns where the X-axis direction and the Y-axis direction are respectively defined as the row direction and the column direction. Moreover, in FIG. 14, the gate length direction of the differential transistors T1, T1, ..., T1 and differential transistors T2, T2, ..., T2 of the differential switches $SW_1, SW_2, \ldots, SW_{65}$ may correspond with the Y-axis direction or the X-axis direction. In FIG. 14, also, the differential transistors T1 and T2 of the differential switches SW$_1$, SW$_2$, ..., SW$_{65}$ may be made of p-channel transistors.

(Layout Design Method for Switch Device)

Next, a layout design method for the switch device will be described. Note that the layout design method may be implemented by execution of a layout design program by a computer (e.g., a personal computer, a workstation, etc.). Such a layout design program may be recorded in a recording medium (e.g., a hard disk, a flexible disk, a CD-ROM, a DVD, etc.) readable by the computer and read from the recording medium by the computer for execution. The layout design program may otherwise be distributed via a network such as the Internet.

<Placement of Elements>

First, the differential switches SW$_1$, SW$_2$, ..., SW$_{65}$ are placed in such a manner that the differential transistors T1 are adjacent to each other and the differential transistors T2 are adjacent to each other (e.g., placed as shown in FIGS. 2, 6-10, 12, and 14). At this time, the guard ring GR may be placed so as to serve as a block between the differential transistors T1 and the differential transistors T2.

<Placement of Interconnects>

Thereafter, interconnects are placed so as to electrically connect the sources (drains in the case of FIG. 12) of the differential transistors T1, T1, ..., T1 of the differential switches SW$_1$, SW$_2$, ..., SW$_{65}$ and the sources (drains in the case of FIG. 12) of the differential transistors T2, T2, ..., T2 thereof to the output nodes OUTP and OUTN, respectively. Likewise, interconnects are placed so as to electrically connect the drains (sources in the case of FIG. 12) of the differential transistors T1, T1, ..., T1 of the differential switches SW$_1$, SW$_2$, ..., SW$_{65}$, and the drains (sources in the case of FIG. 12) of the differential transistors T2, T2, ..., T2 thereof, to the input nodes NIN$_1$, NIN$_2$, ..., NIN$_{65}$, respectively. Further, interconnects are placed so that the control signals DP1, DP2, ..., DP65 be respectively supplied to the gates of the differential transistors T1, T1, ..., T1 of the differential switches SW$_1$, SW$_2$, ..., SW$_{65}$, and the control signals DN1, DN2, ..., DN65 be respectively supplied to the gates of the differential transistors T2, T2, ..., T2 of the differential switches SW$_1$, SW$_2$, ..., SW$_{65}$.

By designing the layout of the switch device in the manner described above, the switch device with enhanced surge protection capability can be designed. Also, since the spacing D1 between the adjacent differential switches SW$_1$, SW$_2$, ..., SW$_{65}$ can be made narrow, the area occupied by the switch device can be reduced.

Other Embodiments

In the above description, the D/A converter 1 may be a converter for converting a digital code into a single output voltage VOUT, or a converter for converting a digital code into a differential voltage made of a pair of output voltages. In this case, the output node OUTN may be connected to the ground node via a load resistance.

When the differential transistors T1 and T2 are made of n-channel transistors, the drains of the differential transistors T1, T1, ..., T1 of the differential switches SW$_1$, SW$_2$..., SW$_{65}$ may be electrically connected to the output node OUTP, the drains of the differential transistors T2, T2, ..., T2 may be electrically connected to the output node OUTN, and the sources of the differential transistors T1, T1, ..., T1 and the sources of the differential transistors T2, T2, ..., T2 may be electrically connected to the input nodes NIN$_1$, NIN$_2$, ..., NIN$_{65}$. Likewise, when the differential transistors T1 and T2 are made of p-channel transistors, the sources of the differential transistors T1, T1, ..., T1 of the differential switches SW$_1$, SW$_2$, ..., SW$_{65}$ may be electrically connected to the output node OUTP, the sources of the differential transistors T2, T2, ..., T2 may be electrically connected to the output node OUTN, and the drains of the differential transistors T1, T1, ..., T1 and the drains of the differential transistors T2, T2, ..., T2 may be electrically connected to the input nodes NIN$_1$, NIN$_2$, ..., NIN$_{65}$. For example, when the current sources IS$_1$, IS$_2$, ..., IS$_{65}$ shown in FIG. 1 are n-type current sources (when they are constituted by n-channel transistors), the differential transistors T1, T1, ..., T1, the differential transistors T2, T2, ..., T2, the current sources IS$_1$, IS$_2$, ..., IS$_{65}$, and the output nodes OUTP and OUTN may be connected as described above.

Moreover, in the above description, the gate widths of any adjacent differential transistors T1 and T1 may be the same or different from each other. Likewise, the gate widths of any adjacent differential transistors T2 and T2 may be the same or different from each other. For example, while the differential transistor T1 of the 2k-th differential switch SW$_{2k}$ is constituted by a plurality of unit transistors T11, T11, ..., T11 (FIG. 6), the differential transistor T1 of the (2k-1)th differential switch SW$_{2k-1}$ may be constituted by a single transistor (FIG. 2).

Although the numbers of differential switches and current sources are "65" in the above description, they may be more than 65 or less than 65.

The switch device is applicable, not only to the current steering D/A converter shown in FIG. 1, but also to other semiconductor integrated circuits such as an HDMI pre-emphasis circuit and a slew-rate control circuit.

As described above, the above switch device, having enhanced surge protection capability, is suitable for current steering D/A converters, pre-emphasis circuits, slew-rate control circuits, etc.

It should be noted that the aforementioned embodiments illustrate essentially preferable examples, and are not intended to limit the scopes of the present disclosure, its applications, and its uses.

What is claimed is:

1. A switch device, comprising:
   a plurality of differential switches formed in a semiconductor substrate, each of the plurality of differential switches having a first differential transistor and a second differential transistor, wherein:
   in each of the plurality of differential switches,
      one of a source and a drain of the first differential transistor is electrically connected to a first output node, the other one of the source and the drain of the first differential transistor is electrically connected to an input node corresponding to the differential switch, and a first control signal corresponding to the differential switch is supplied to a gate of the first differential transistor,
      one of a source and a drain of the second differential transistor is electrically connected to a second output node, the other one of the source and the drain of the second differential transistor is electrically connected to the input node corresponding to the differential switch, and a second control signal corresponding to the differential switch is supplied to a gate of the second differential transistor,
   all first output nodes of the plurality of differential switches are electrically connected to a common first output terminal and all second output nodes of the plurality of differential switches are electrically connected to a common second output terminal, and the plurality of differential switches are placed in the semiconductor substrate in such a manner that the first differential transistors are adjacent to each other and the second differential transistors are adjacent to each other.

2. The switch device of claim 1, further comprising:
a guard ring formed in the semiconductor substrate so as to serve as a block between the first differential transistor and the second differential transistor.

3. The switch device of claim 1, wherein:
the plurality of differential switches are arranged in a first direction, and
the first and second differential transistors of the plurality of differential switches are arranged in such a manner that the first differential transistor of a 2k-th differential switch is adjacent to the first differential transistor of a (2k−1)th differential switch and the second differential transistor of the 2k-th differential switch is adjacent to the second differential transistor of a (2k+1)th differential switch, where k is a natural number.

4. The switch device of claim 1, wherein:
the plurality of differential switches are arranged in a matrix where a first direction and a second direction orthogonal to the first direction are respectively defined as its row direction and column direction,
in each row of the differential switches, the first and second differential transistors of the differential switches of the row are arranged in the first direction in such a manner that the first differential transistor of a 2k-th differential switch is adjacent to the first differential transistor of a (2k−1)th differential switch and the second differential transistor of the 2k-th differential switch is adjacent to the second differential transistor of a (2k+1)th differential switch, where k is a natural number, and
in each column of the differential switches, the first and second differential transistors of the differential switches of the column are arranged in the second direction in such a manner that the first differential transistors face the second differential transistors in the first direction.

5. The switch device of claim 3, wherein
the gate length direction of the first and second differential transistors of the plurality of differential switches corresponds with a second direction orthogonal to the first direction.

6. The switch device of claim 3, wherein
the gate length direction of the first and second differential transistors of the plurality of differential switches corresponds with the first direction.

7. The switch device of claim 1, wherein:
the first differential transistor and second differential transistor of each of the plurality of differential switches are respectively constituted by a plurality of first unit transistors and a plurality of second unit transistors, and
in each of the plurality of differential switches,
one of a source and a drain of each of the plurality of first unit transistors is electrically connected to the first output node, the other one of the source and the drain of each of the plurality of first unit transistors is electrically connected to the input node corresponding to the differential switch, and the first control signal corresponding to the differential switch is supplied to a gate of each of the plurality of first unit transistors, and
one of a source and a drain of each of the plurality of second unit transistors is electrically connected to the second output node, the other one of the source and the drain of each of the plurality of second unit transistors is electrically connected to the input node corresponding to the differential switch, and the second control signal corresponding to the differential switch is supplied to a gate of each of the plurality of second unit transistors.

8. The switch device of claim 1, wherein
the first and second differential transistors of the plurality of differential switches are n-channel transistors.

9. The switch device of claim 1, wherein
the first and second differential transistors of the plurality of differential switches are p-channel transistors.

10. The switch device of claim 1, wherein:
the plurality of differential switches are arranged in a first direction, and
the first and second differential transistors of the plurality of differential switches are arranged in the first direction in such a manner that the first differential transistors face the second differential transistors in a second direction orthogonal to the first direction.

11. A layout design method for designing a layout of a switch device including a plurality of differential switches each having first and second differential transistors, the method comprising steps of:
(a) placing the plurality of differential switches in such a manner that the first differential transistors are adjacent to each other and the second differential transistors are adjacent to each other;
(b) placing interconnects in such a manner that, in each of the plurality of differential switches,
one of a source and a drain of the first differential transistor is electrically connected to a first output node, the other one of the source and the drain of the first differential transistor is electrically connected to an input node corresponding to the differential switch, and a first control signal corresponding to the differential switch is supplied to a gate of the first differential transistor, and
one of a source and a drain of the second differential transistor is electrically connected to a second output node, the other one of the source and the drain of the second differential transistor is electrically connected to an input node corresponding to the differential switch, and a second control signal corresponding to the differential switch is supplied to a gate of the second differential transistor; and
(c) placing interconnects in such a manner that all first output nodes of the plurality of differential switches are electrically connected to a common first output terminal and all second output nodes of the plurality of differential switches are electrically connected to a common second output terminal.

12. A layout design program configured to allow a computer to execute the layout design method of claim 11.

13. A non-transitory recording medium storing a layout design program which, when executed by a computer, causes the computer to execute the layout design method of claim 11.

14. The switch device of claim 4, wherein
a gate length direction of the first and second differential transistors of the plurality of differential switches corresponds with the second direction orthogonal to the first direction.

15. The switch device of claim 4, wherein
a gate length direction of the first and second differential transistors of the plurality of differential switches corresponds with the first direction.

16. A switch device, comprising:
a plurality of differential switches formed in a semiconductor substrate, each of the plurality of differential switches having a first differential transistor and a second differential transistor, wherein
in each of the plurality of differential switches,
the first differential transistor is electrically connected to a first output node, and
the second differential transistor is electrically connected to a second output node,
all first output nodes of the plurality of differential switches are electrically connected to a common first output terminal and all second output nodes of the plurality of differential switches are electrically connected to a common second output terminal, and
the plurality of differential switches are placed in the semiconductor substrate in such a manner that the first differential transistors are adjacent to each other and the second differential transistors are adjacent to each other.

17. The switch device of claim 2, wherein
the guard ring further surrounds the plurality of differential switches.

\* \* \* \* \*